United States Patent
Sturtevant et al.

(10) Patent No.: US 10,445,452 B2
(45) Date of Patent: Oct. 15, 2019

(54) SIMULATION-ASSISTED WAFER REWORK DETERMINATION

(71) Applicant: Mentor Graphics Corporation, Wilsonville, OR (US)

(72) Inventors: John L. Sturtevant, Portland, OR (US); Shumay Dou Shang, Saratoga, CA (US); Konstantinos G. Adam, Belmont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 190 days.

(21) Appl. No.: 15/725,219

(22) Filed: Oct. 4, 2017

(65) Prior Publication Data
US 2019/0102501 A1    Apr. 4, 2019

(51) Int. Cl.
| | |
|---|---|
| *G06F 17/50* | (2006.01) |
| *G03F 1/00* | (2012.01) |
| *G03F 7/00* | (2006.01) |
| *G03F 7/20* | (2006.01) |
| *G03F 1/84* | (2012.01) |
| *G03F 1/72* | (2012.01) |

(Continued)

(52) U.S. Cl.
CPC .......... *G06F 17/5068* (2013.01); *G03F 1/70* (2013.01); *G03F 1/72* (2013.01); *G03F 1/84* (2013.01); *G03F 7/7065* (2013.01); *G03F 7/70616* (2013.01); *G06F 17/5009* (2013.01); *G06F 17/5081* (2013.01); *G03F 1/36* (2013.01)

(58) Field of Classification Search
None
See application file for complete search history.

(56) References Cited

U.S. PATENT DOCUMENTS

| | | | |
|---|---|---|---|
| 6,768,538 B2 * | 7/2004 | Gau | ............... H01L 21/67225 355/53 |
| 7,349,752 B1 | 3/2008 | Sturtevant | |

(Continued)

OTHER PUBLICATIONS

John L Sturtevant et al. "Two-layer critical dimensions and overlay process window characterization and improvement in full-chip computational lithography," Journal of Micro/Nanolith. MEMS MOEMS, Apr.-Jun. 2016, vol. 15(2).

(Continued)

*Primary Examiner* — Leigh M Garbowski

(57) ABSTRACT

Aspects of the disclosed technology relate to techniques for using hotspot simulation to make wafer rework decisions. Metrology data of photoresist patterns created based on a layout design for a circuit design by a photolithographic processing step are received during a lithographic process. Hotspots of interest are selected based on comparing the metrology data with simulated metrology data associated with hotspots. The simulated metrology data and information of the hotspots are generated by performing lithographic simulation on the layout design before the lithographic process and stored in a library of potential hotspots. Lithography simulation is performed on the selected hotspots of interest using process conditions of the photolithographic processing step to generate simulated hotspot data. The simulated hotspot data are analyzed to determine whether rework of the one or more wafers or a wafer lot to which the one or more wafers belong is needed.

17 Claims, 4 Drawing Sheets

(51) Int. Cl.
 *G03F 1/70* (2012.01)
 *G03F 1/36* (2012.01)

(56) References Cited

U.S. PATENT DOCUMENTS

| | | | | |
|---|---|---|---|---|
| 7,673,278 | B2* | 3/2010 | Rathsack | H01L 22/20 716/56 |
| 7,853,920 | B2* | 12/2010 | Preil | G03F 1/84 382/149 |
| 8,150,140 | B2* | 4/2012 | Kitamura | G06T 7/001 348/126 |
| 8,863,043 | B1* | 10/2014 | Usui | G06F 17/5081 430/30 |
| 9,507,907 | B2* | 11/2016 | Fouquet | G06F 17/5081 |
| 9,740,805 | B1* | 8/2017 | Bergman | G03F 7/00 |
| 9,990,451 | B2* | 6/2018 | Hunsche | G06F 17/5009 |
| 10,030,965 | B2* | 7/2018 | Pandev | G01B 11/00 |
| 10,234,401 | B2* | 3/2019 | Buhl | G05B 19/4188 |
| 2006/0258023 | A1* | 11/2006 | Rolofson | H01L 22/20 438/14 |
| 2008/0058977 | A1* | 3/2008 | Honda | G03F 1/86 700/110 |
| 2008/0298669 | A1* | 12/2008 | Funakoshi | G01N 21/95607 382/145 |
| 2019/0137892 | A1* | 5/2019 | Cekli | H01L 22/20 |
| 2019/0147127 | A1* | 5/2019 | Su | G03F 7/705 |

OTHER PUBLICATIONS

John L Sturtevant et al."Characterization and mitigation of relative edge placement errors (rEPE) in full-chip computational lithography," Proc. of SPIE vol. 9635, Photomask Technology 2015.

* cited by examiner

SIMULATION-ASSISTED WAFER REWORK DETERMINATION

FIELD OF THE DISCLOSED TECHNOLOGY

The present disclosed technology relates to the field of lithography. Various implementations of the disclosed technology may be useful for determining wafers that need to be reworked at the photolithographic phase of semiconductor manufacturing.

BACKGROUND OF THE DISCLOSED TECHNOLOGY

During the semiconductor manufacturing process, a wafer is fabricated one layer after another. In each layer, geometric patterns associated with circuit components are printed in photoresists by photolithography, which are followed by etching and film deposition to create patterns of various materials such as metal, semiconductor and insulator. Defective wafers sometimes occur in the process, especially when the yield is being ramped up. In general, few remedy methods exist for a defective wafer. However, wafers with defective photoresist patterns can be reworked to reduce manufacturing costs. Rework involves a plasma and/or chemical solvent removal of the photoresist film.

Defective photoresist patterns typically have critical dimension errors and/or overlay errors. Critical dimension errors are errors involving feature sizes, while overlay errors are errors associated with how two patterning layers such as a via and a metal line overlap. Conventionally, specifications for critical dimension errors and overlay errors are established based on layout design rules, device performance and reliability requirements. These specifications usually do not consider either manufacturing condition variations (e.g., dose, focus and alignment) between lots or batches or differences between circuit designs. At the advanced technology nodes with increasing proximity effects between neighboring features, these factors can cause defective wafers and significantly lower the yield. Conventionally, worst-case critical dimension/overlay error tolerances are often used for determining the specifications. This increases rework rates, expands unnecessary manufacturing resources, extends fabrication time and results in increased manufacturing costs.

Accordingly, there is a need for methods of wafer rework determination that are based on particular circuit designs and utilize in-fab metrology data. The presently disclosed technology attempts to meet this need.

BRIEF SUMMARY OF THE DISCLOSED TECHNOLOGY

Aspects of the disclosed technology relate to techniques for using hotspot simulation to make wafer rework decisions. In one aspect, there is a method comprising: receiving metrology data of photoresist patterns on one or more wafers, the metrology data comprising values of critical dimension data, overlay error data or both, the photoresist patterns being created based on a layout design for a circuit design by a photolithographic processing step during a lithographic process; selecting hotspots of interest based on comparing the metrology data with simulated metrology data associated with hotspots, wherein the simulated metrology data and information of the hotspots are generated by performing lithographic simulation on the layout design before the lithographic process and stored in a non-transitory computer-readable medium; performing lithography simulation on the hotspots of interest for the one or more wafers using process conditions of the photolithographic processing step to generate simulated hotspot data; and analyzing the simulated hotspot data to determine whether rework of the one or more wafers or a wafer lot to which the one or more wafers belong is needed.

The method may further comprise: performing a next processing step on the one or more wafers or the wafer lot if the rework is not needed; and removing the photoresist patterns and performing the photolithographic processing step on the one or more wafers or the wafer lot if the rework is needed.

The process conditions may comprise focus, dose, mask bias, misalignment, or any combination thereof. The information of the hotspots may comprise location information of the hotspots and information of failure mechanism associated with the hotspots. Examples of the failure mechanism may include pinch, bridge or area coverage.

The analyzing may comprise: deriving defect-related data in the simulated hotspot data; and comparing the defect-related data with predetermined threshold values. The defect-related data may comprise minimum spacing values for bridge-type hotspots, minimum overlapping area values for overlay-type hotspots, or both.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1:
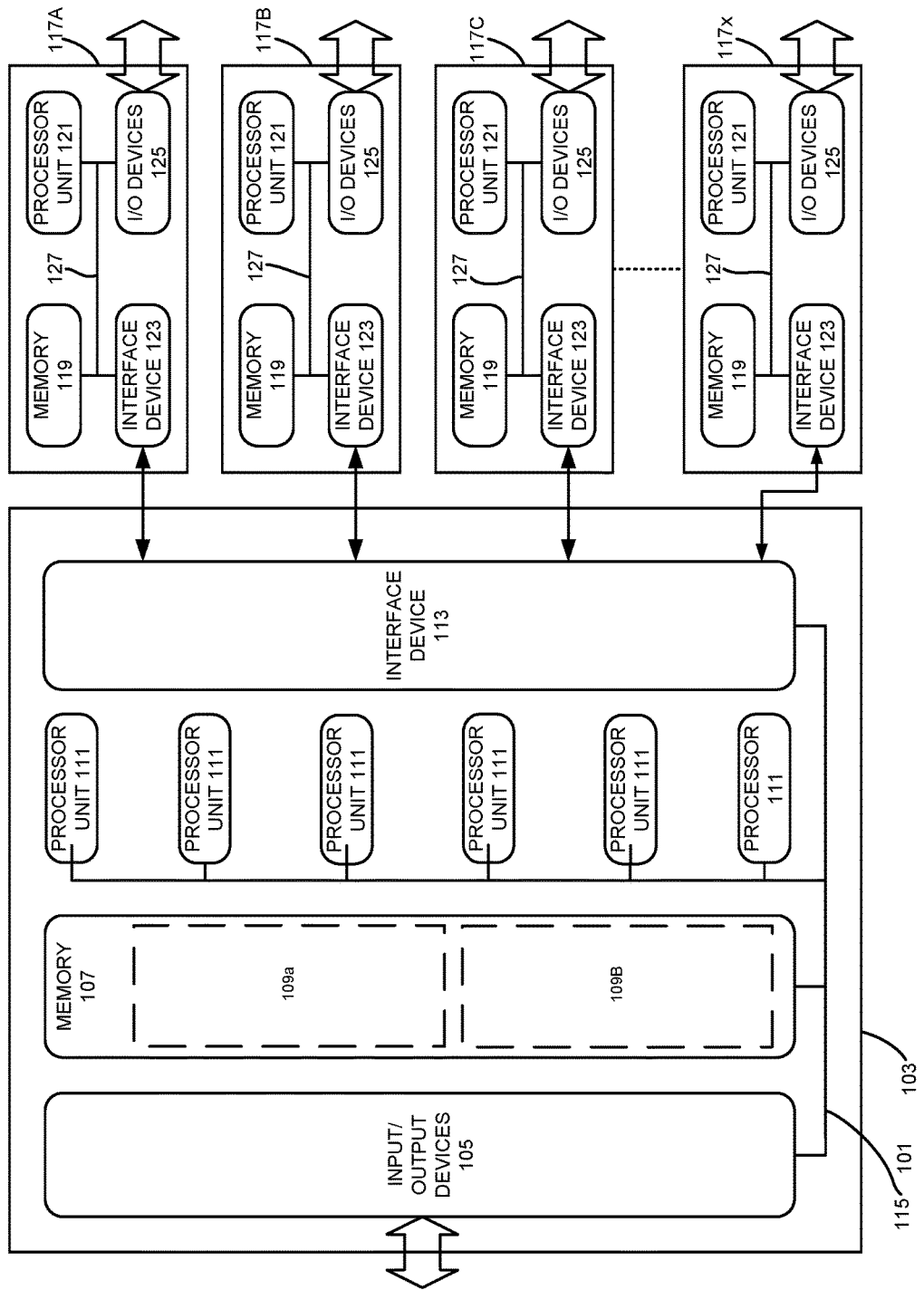
FIG. 1 illustrates an example of a computing system that may be used to implement various embodiments of the disclosed technology.

Various aspects of the present disclosed technology relate to a process of using hotspot simulation to make wafer rework decisions. In the following description, numerous details are set forth for the purpose of explanation. However, one of ordinary skill in the art will realize that the disclosed technology may be practiced without the use of these specific details. In other instances, well-known features have not been described in details to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "receive," "select," "perform" and "analyze" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
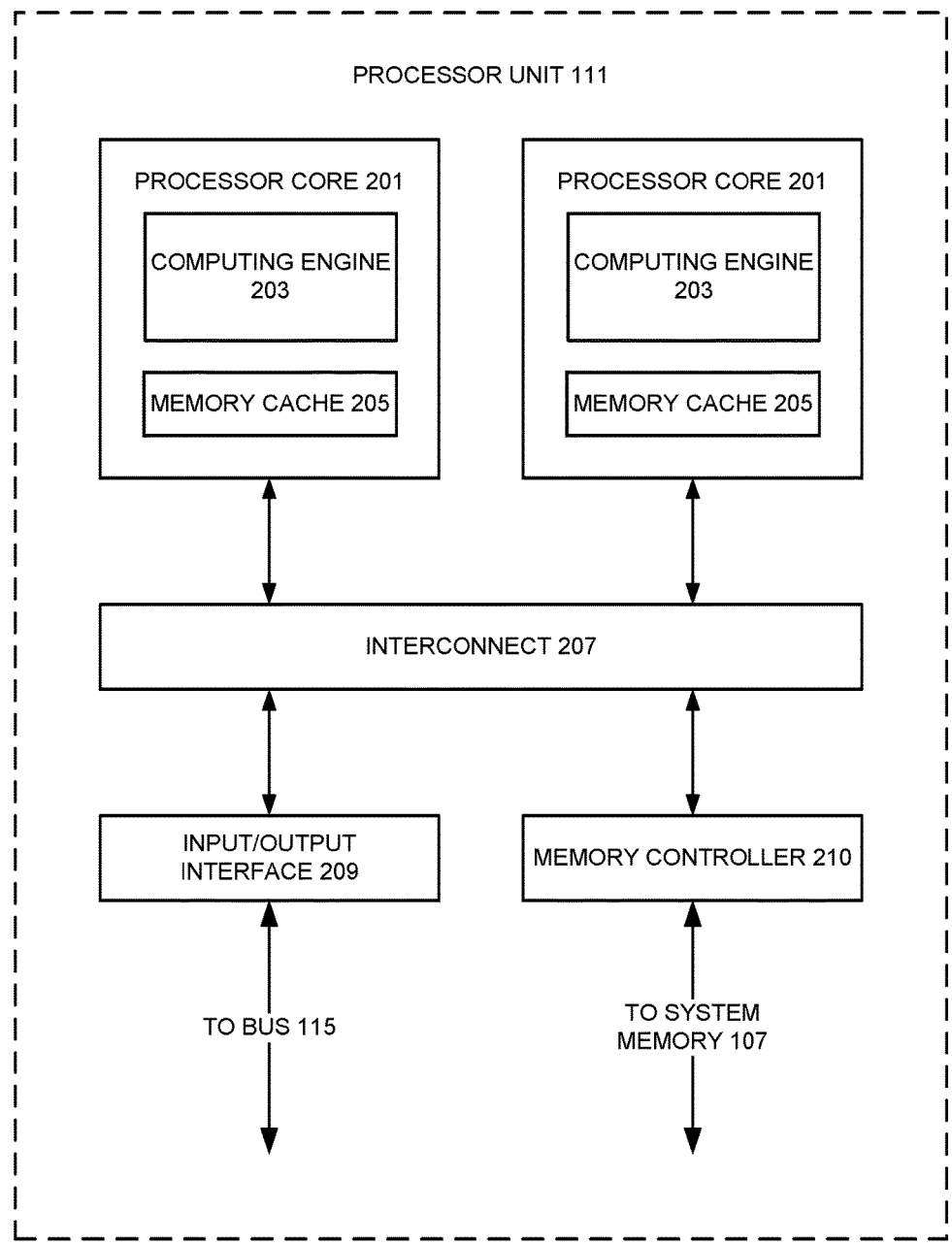
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the disclosed technology, the processor units 201 may include additional components, such as a high-level cache memory accessible shared by the processor cores 201.

While FIG. 2 shows one illustration of a processor unit 201 that may be employed by some embodiments of the disclosed technology, it should be appreciated that this illustration is representative only, and is not intended to be limiting. For example, some embodiments of the disclosed technology may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Circuit Design, Verification And Manufacture

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, such as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask.

Wafer Rework Determination Tool

Figure 3:
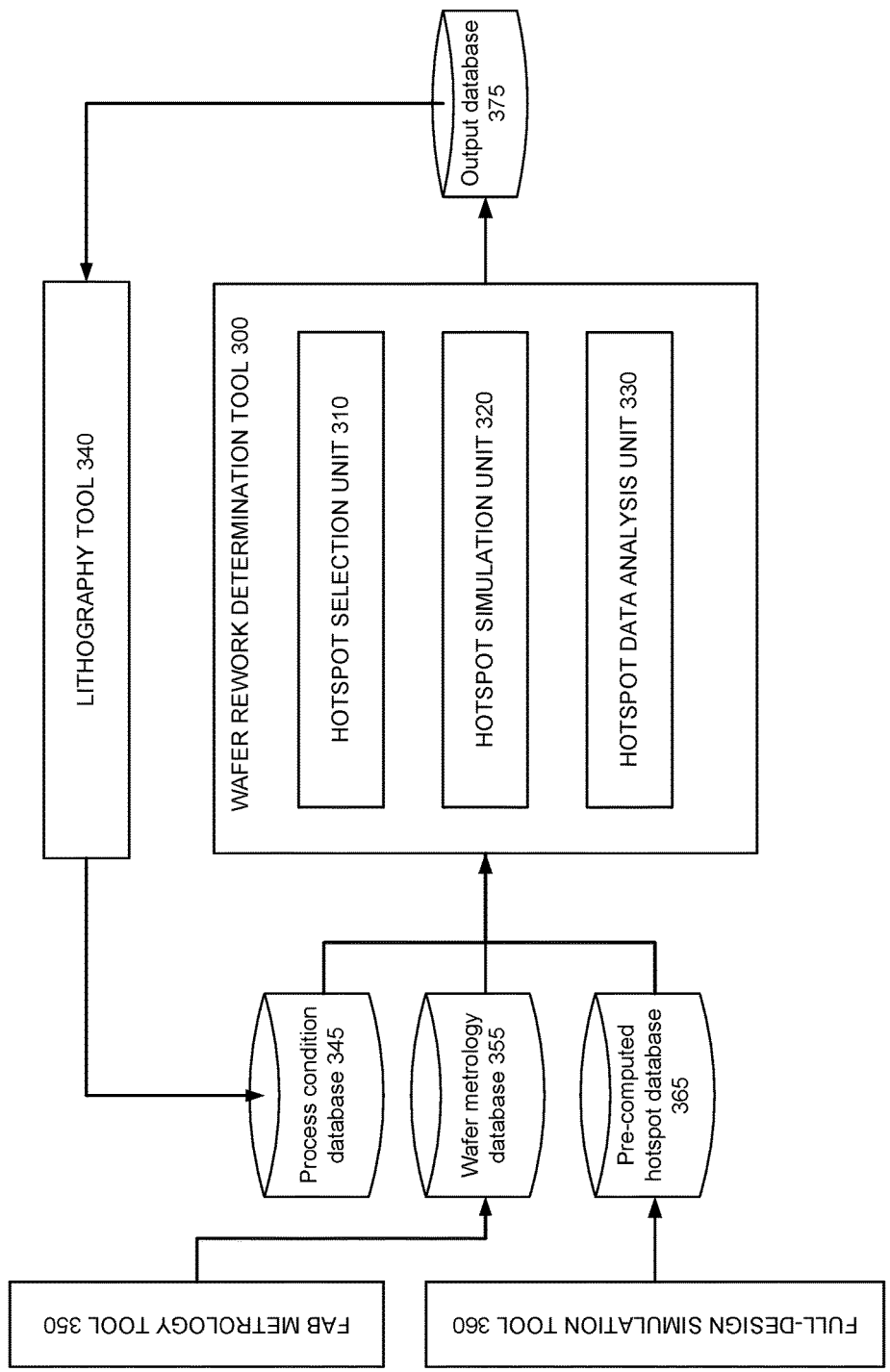
FIG. 3 illustrates an example of a wafer rework determination tool according to various embodiments of the disclosed technology.

FIG. 3 illustrates an example of a wafer rework determination tool 300 according to various embodiments of the disclosed technology. As seen in this figure, the wafer rework determination tool 300 includes a hotspot selection unit 310, a hotspot simulation unit 320, and a hotspot data analysis unit 330. Some implementations of the wafer rework determination tool 300 may cooperate with (or incorporate) one or more of a process condition database 345, a wafer metrology database 355, a pre-computed hotspot database 365 and an output database 375. Also shown in the figure are a lithography tool 340, a fab metrology tool 350 and a full-design simulation tool 360. The lithography tool 340 and the fab metrology tool 350 can operate together with the wafer rework determination tool 300 during a lithographic process, while the full-design simulation tool 360 operates before the lithographic process.

As will be discussed in more detail below, the wafer rework determination tool 300 can receive metrology data of photoresist patterns created on one or more wafers from the wafer metrology database 355 after a photolithographic processing step during a lithographic process. The metrology data, comprising critical dimension data, overlay error data, focus errors, dose errors, mask CD errors, or any combination thereof, are generated by the fab metrology tool 350 and/or the lithography tool 340. The photoresist patterns are created based on a layout design for a circuit design.

The hotspot selection unit 310 selects hotspots of interest based on comparing the metrology data with simulated metrology data associated with hotspots stored in the pre-computed hotspot database 365. Here, the simulated metrology and information of the hotspots are generated by the full-design simulation tool 360 which performs lithographic simulation on the layout design before the lithographic process.

The hotspot simulation unit 320 performs lithography simulation on the hotspots of interest for the one or more wafers using process conditions of the photolithographic processing step stored in the process condition database 345 to generate simulated hotspot data. The process conditions may comprise focus, dose, mask bias, misalignment, or any combination thereof.

The hotspot data analysis unit 330 determines whether rework of the one or more wafers or a wafer lot to which the one or more wafers belong is needed based on the simulated hotspot data. If the rework is not needed, the lithography tool 340 can perform the next photolithographic processing step on the one or more wafers or the wafer lot; if the rework is needed, the photoresist patterns are removed and the lithography tool 340 can repeat the photolithographic processing step on the one or more wafers or the wafer lot. The process conditions may be adjusted.

As previously noted, various examples of the disclosed technology may be implemented by one or more computing systems, such as the computing system illustrated in FIGS. 1 and 2. Accordingly, one or more of the hotspot selection unit 310, the hotspot simulation unit 320, the hotspot data analysis unit 330, and the full-design simulation tool 360 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the hotspot selection unit 310, the hotspot simulation unit 320, the hotspot data analysis unit 330, and the full-design simulation tool 360. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the hotspot selection unit 310, the hotspot simulation unit 320, and the hotspot data analysis unit 330 are shown as separate units in FIG. 3, a single computer (or a single processor within a master computer) or a single computer system may be used to implement all of these units at different times, or components of these units at different times.

The lithography tool 340 may comprise a scanner such as the TWINSCAN systems manufactured by ASML, a Dutch company. The fab metrology tool 350 may comprise a tool or tools manufactured by KLA-Tencor or several other suppliers. These two tools may be combined together into one system.

With various examples of the disclosed technology, the process condition database 345, the wafer metrology database 355, the pre-computed hotspot database 365 and the output database 375 may be implemented using any suitable computer readable storage device. That is, any of the process condition database 345, the wafer metrology database 355, the pre-computed hotspot database 365 and the output database 375 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the process condition database 345, the wafer metrology database 355, the pre-computed hotspot database 365 and the output database 375 are shown as separate units in FIG. 3, a single data storage medium may be used to implement some or all of these databases.

Wafer Lot Rework Determination

Figure 4:
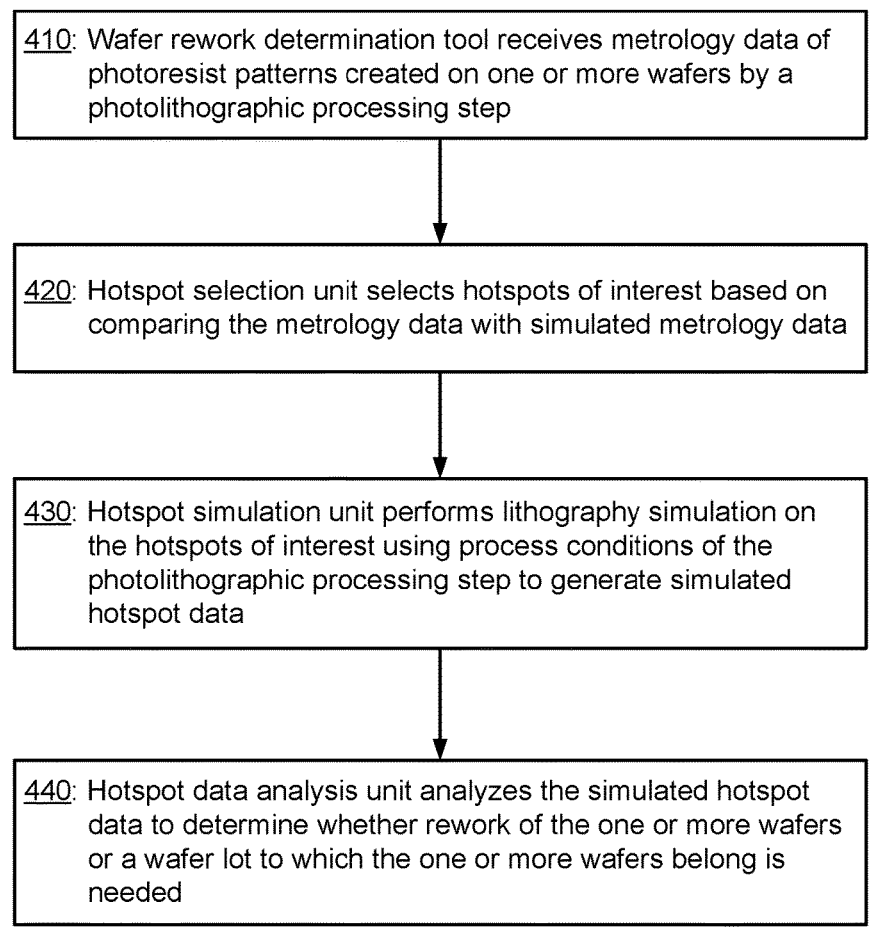
FIG. 4 illustrates a flowchart showing a process of using hotspot simulation to make wafer rework decisions that may be implemented according to various examples of the disclosed technology.

FIG. 4 illustrates a flowchart 400 showing a process of simulation-assisted wafer rework determination that may be implemented according to various examples of the disclosed technology. For ease of understanding, methods of simulation-assisted wafer rework determination that may be employed according to various embodiments of the disclosed technology will be described with reference to the wafer rework determination tool 300 in FIG. 3 and the flow chart 400 illustrated in FIG. 4. It should be appreciated, however, that alternate implementations of a wafer rework determination tool may be used to perform the methods of simulation-assisted wafer rework determination illustrated by the flow chart 400 according to various embodiments of the disclosed technology. Likewise, the wafer rework determination tool 300 may be employed to perform other methods of simulation-assisted wafer rework determination according to various embodiments of the disclosed technology.

In operation 410, the wafer rework determination tool 300 receives metrology data of photoresist patterns. The photoresist patterns are created on one or more wafers based on a layout design for a circuit design by a photolithographic processing step during a lithographic process. To check the quality of the derived patterns, the fab metrology tool 350 typically selects a few wafers from a lot (or a batch) of wafers and measure some pattern dimensions of several dies on each of the selected wafers. The metrology data comprise critical dimension data, overlay error data or both and are stored in the wafer metrology database 355. The metrology data may also comprise focus and dose errors and potentially mask CD errors. The metrology data may be generated additionally or alternatively by the lithography tool 340.

In operation 420, the hotspot selection unit 310 selects hotspots of interest based on comparing the metrology data with simulated metrology data associated with hotspots stored in the pre-computed hotspot database 365. A hotspot is region of a layout design having poor printability and yield. A hotspot can lead to defects such as bridging, pinching, line-end pullback and overlapping defects. A hotspot may be corrected by modifying the layout design before tape-out or adjusting conditions of the lithographic process during manufacturing.

The full-design simulation tool 360 can identify the hotspots by performing lithographic simulation on the layout design. Instead of simulating only nominal process conditions, the off-nominal process conditions can be utilized to identify hotspots under different combinations of lithographic conditions. The full-design simulation tool 360 can derive the simulated metrology data including simulated critical dimension data, simulated overlay error data, or both for various combinations of process conditions from the simulation results. The simulated metrology data can be stored with the corresponding information of the hotspots in the pre-computed hotspot database 365 to form a library of potential hotspots for the layout design. The information of the hotspots may comprise location information of the hotspots. The information of the hotspots may further comprise failure mechanisms associated with the hotspots, such as pinch, bridge, or area coverage. By matching the metrology data with the simulated metrology data, the hotspot selection unit 310 can select hotspots associated with a particular process condition combination for the present wafer or the wafer lot.

Simulation over various lithographic process conditions is sometimes referred to as process window simulation. The typically process conditions (process window conditions) include dose, focus, and mask critical dimension for single-layer hotspot analysis. For interlayer hotspots, additional process variables such as misalignment can be introduced. Misalignment can cause overlay errors associated with metal—via area overlap, poly endcap past active, gate CD statistics over the active region. The addition of misalignment is particular important for multi-patterning processes. The library of potential hotspots stored in the pre-computed hotspot database 365 can also contain the process condition information associated with each of the hotspots. The full-design simulation tool 360 can be implemented using a commercial process window simulation tool, such as those (e.g., Calibre OPCVerify) in the Calibre family of software tools available from Mentor Graphics Corporation, Wilsonville, Oreg.

In operation 430, the hotspot simulation unit 320 performs lithography simulation on the hotspots of interest for the one or more wafers using process conditions of the photolithographic processing step to generate simulated hotspot data. The process conditions of the photolithographic processing step are stored in the process condition database 345 and may comprise focus, dose, mask bias, misalignment, or any combination thereof. The simulation may be performed for one or more of the dies on the wafer. Because only the selected hotspots of interest are simulated, the operation can be completed much faster than the full design simulation. However, the hotspot simulation unit 320 may be implemented by the same tool or employ the same core codes as the full-design simulation tool 360.

In operation 440, the hotspot data analysis unit 330 analyzes the simulated hotspot data to determine whether rework of the one or more wafers or a wafer lot to which the one or more wafers belong is needed. The analysis may comprise deriving defect-related data in the simulated hotspot data; and comparing the defect-related data with predetermined threshold values. For example, the defect-related data may be minimum spacing values for bridging defects, minimum line width values for pinching defects and minimum overlapping areas for overlay defects. If the rework is not needed, the next processing step is going to be performed on the one or more wafers or the wafer lot. Otherwise, the photoresist patterns are removed and the photolithographic processing step is repeated on the one or more wafers or the wafer lot. The conditions may be changed by adjusting focus, dose and/or alignment.

The following pseudo-code is an example for implementing the operations 420-440:

```
FOR each chip 1-544
FOR each hotspot 1-432,000
*compare pre compute meta-data to determine if sim will be active*
IF {CDV1sim = CDV1w} AND {CDI1sim = CDI1w } AND {CDM1sim =CDM1w)
   AND {OVLYOCTsim=OVLYOCTw} AND {OVLMAG> $OVLYMAGLIMIT}
(3nm?)
THEN $ACTIVE = 1
ELSE $ACTIVE = 0
*conduct simulations on subset of 432000. But need to have the 8 wafer parameters
present*
IF $ACTIVE = 1
THEN simulate clip using wafer site data specifically mapped to the chip values
(Focus V1, Dose V1, Focus I1, Dose I1, Focus M1, Dose M1, overlay V1-M1 X,
overlay V1-M1 Y)
*Determine pass/fail of chip, count total fails per chip*
```

```
IF HS type = bridge
THEN IF minspace(V1-M1)< 5 nm
    THEN FAILCOUNTBRIDGE= FAILCOUNTBRIDGE + 1
    ELSE PASSCOUNTBRIDGE= PASSCOUNTBRIDGE +1
IF HS type = area
THEN IF minarea(V1-M1)<0.001 nm2
    THEN FAILCOUNTAREA= FAILCOUNTAREA + 1
    ELSE PASSCOUNTAREA= PASSCOUNTAREA +1
Generate wafer map showing FAILCOUNTAREA, FAILCOUNTBRIDGE per chip
Generate % of total chips (544) with FAILCOUNTAREA>1 or
FAILCOUNTBRIDGE >1
```

In this example, the pre-computed library of potential hotspots has 432,000 hotspots and the wafer has 544 dies. The pseudo-code focuses on interlayer hotspots. The two layers involved are: a metal layer formed by double patterning using masks M1 and L1 and a via layer formed by single patterning using mask V1. If the measured critical dimension (CD) and overlay error (OVLYOCT for direction and OVLYMAG for magnitude) data for each of the masks match the simulated ones, the corresponding hotspots are selected, i.e. being activated ($ACTIVE=1). The code use "=" to represent some of the matches. It should be noted that the equal sign "=" does not mean an exact numerical equivalence but an equivalence within some range. If the hotspot is of the bridge type and the minimum space is less than 5 nm, then the fail count of bridge hotspots is increased by one; and if the hotspot is of the overlay error type and the minimum overlay area is less than 0.001 nm$^2$, then the fail count of overlay hotspots is increased by one. These two fail counts may be used to generate wafer map and/or a percentage of total dies (chips) with either of the fail count greater than one, which can be used to make a decision for rework.

The disclosed technology employs hotspot simulation to help make rework decisions. The hotspot simulation takes into account various proximity effects of a particular design and uses process conditions as inputs which may vary between lots. This design-specific and dynamic process avoids using specifications based on worst-case tolerances, and can thus reduce manufacturing costs.

Conclusion

While the disclosed technology has been specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method, executed by at least one processor of a computer, comprising:
   receiving metrology data of photoresist patterns on one or more wafers, the metrology data comprising values of critical dimension data, overlay error data or both, the photoresist patterns being created based on a layout design for a circuit design by a photolithographic processing step during a lithographic process;
   selecting hotspots of interest based on comparing the metrology data with simulated metrology data associated with hotspots, wherein the simulated metrology data and information of the hotspots are generated by performing lithographic simulation on the layout design before the lithographic process and stored in a non-transitory computer-readable medium;
   performing lithography simulation on the hotspots of interest for the one or more wafers using process conditions of the photolithographic processing step to generate simulated hotspot data; and
   analyzing the simulated hotspot data to determine whether rework of the one or more wafers or a wafer lot to which the one or more wafers belong is needed.

2. The method recited in claim 1, further comprising:
   performing a next processing step on the one or more wafers or the wafer lot if the rework is not needed; and
   removing the photoresist patterns and performing the photolithographic processing step on the one or more wafers or the wafer lot if the rework is needed.

3. The method recited in claim 1, wherein the process conditions comprise focus, dose, mask bias, misalignment, or any combination thereof.

4. The method recited in claim 1, wherein the analyzing comprises:
   deriving defect-related data in the simulated hotspot data; and
   comparing the defect-related data with predetermined threshold values.

5. The method recited in claim 4, wherein the defect-related data comprise minimum spacing values for bridge-type hotspots, minimum overlapping area values for overlay-type hotspots, or both.

6. The method recited in claim 1, wherein the information of the hotspots comprises location information of the hotspots and information of failure mechanism associated with the hotspots.

7. One or more non-transitory computer-readable media storing computer-executable instructions for causing one or more processors to perform a method, the method comprising:
   receiving metrology data of photoresist patterns on one or more wafers, the metrology data comprising values of critical dimension data, overlay error data or both, the photoresist patterns being created based on a layout design for a circuit design by a photolithographic processing step during a lithographic process;
   selecting hotspots of interest based on comparing the metrology data with simulated metrology data associated with hotspots, wherein the simulated metrology data and information of the hotspots are generated by performing lithographic simulation on the layout design before the lithographic process and stored in a non-transitory computer-readable medium;

performing lithography simulation on the hotspots of interest for the one or more wafers using process conditions of the photolithographic processing step to generate simulated hotspot data; and analyzing the simulated hotspot data to determine whether rework of the one or more wafers or a wafer lot to which the one or more wafers belong is needed.

8. The one or more non-transitory computer-readable media recited in claim 7, wherein the method further comprises:

performing a next processing step on the one or more wafers or the wafer lot if the rework is not needed; and removing the photoresist patterns and performing the photolithographic processing step on the one or more wafers or the wafer lot if the rework is needed.

9. The one or more non-transitory computer-readable media recited in claim 7, wherein the process conditions comprise focus, dose, mask bias, misalignment, or any combination thereof.

10. The one or more non-transitory computer-readable media recited in claim 7, wherein the analyzing comprises:

deriving defect-related data in the simulated hotspot data; and comparing the defect-related data with predetermined threshold values.

11. The one or more non-transitory computer-readable media recited in claim 10, wherein the defect-related data comprise minimum spacing values for bridge-type hotspots, minimum overlapping area values for overlay-type hotspots, or both.

12. The one or more non-transitory computer-readable media recited in claim 7, wherein the information of the hotspots comprises location information of the hotspots and information of failure mechanism associated with the hotspots.

13. A system, comprising:

one or more processors, the one or more processors programmed to perform a method, the method comprising:

receiving metrology data of photoresist patterns on one or more wafers, the metrology data comprising values of critical dimension data, overlay error data or both, the photoresist patterns being created based on a layout design for a circuit design by a photolithographic processing step during a lithographic process;

selecting hotspots of interest based on comparing the metrology data with simulated metrology data associated with hotspots, wherein the simulated metrology data and information of the hotspots are generated by performing lithographic simulation on the layout design before the lithographic process and stored in a non-transitory computer-readable medium;

performing lithography simulation on the hotspots of interest for the one or more wafers using process conditions of the photolithographic processing step to generate simulated hotspot data; and analyzing the simulated hotspot data to determine whether rework of the one or more wafers or a wafer lot to which the one or more wafers belong is needed.

14. The system recited in claim 13, wherein the analyzing comprises:

deriving defect-related data in the simulated hotspot data; and comparing the defect-related data with predetermined threshold values.

15. The system recited in claim 14, wherein the defect-related data comprise minimum spacing values for bridge-type hotspots, minimum overlapping area values for overlay-type hotspots, or both.

16. The system recited in claim 13, wherein the process conditions comprise focus, dose, mask bias, misalignment, or any combination thereof.

17. The system recited in claim 13, wherein the information of the hotspots comprises location information of the hotspots and information of failure mechanism associated with the hotspots.

* * * * *